United States Patent [19]

Watkins

[11] Patent Number: 4,901,259

[45] Date of Patent: Feb. 13, 1990

[54] ASIC EMULATOR

[75] Inventor: Daniel R. Watkins, Saratoga, Calif.

[73] Assignee: LSI Logic Corporation, Milpitas, Calif.

[21] Appl. No.: 232,269

[22] Filed: Aug. 15, 1988

[51] Int. Cl.[4] .......................... G06G 7/48; G06F 11/00
[52] U.S. Cl. .................................... 364/578; 364/488; 364/900; 371/23
[58] Field of Search .................. 364/578, 488, 900; 371/23

[56] References Cited

U.S. PATENT DOCUMENTS

| | | | |
|---|---|---|---|
| 3,932,843 | 1/1976 | Trelut et al. | 371/23 |
| 4,342,093 | 7/1982 | Miyoshi | 364/578 |
| 4,590,581 | 5/1986 | Widdoes, Jr. | 364/578 |
| 4,633,417 | 12/1986 | Wilburn et al. | 364/578 |
| 4,635,218 | 1/1987 | Widdoes, Jr. | 364/578 |
| 4,644,487 | 2/1987 | Smith | 364/578 |
| 4,725,971 | 2/1988 | Doshi et al. | 364/578 |
| 4,736,338 | 4/1988 | Saxe et al. | 364/578 |
| 4,763,288 | 8/1988 | Deering et al. | 364/578 |

Primary Examiner—Parshotam S. Lall
Assistant Examiner—V. N. Trans
Attorney, Agent, or Firm—Skjerven, Morrill, MacPherson, Franklin & Friel

[57] ABSTRACT

Disclosed is a simulation model which facilitates the "real-time" simulation of application specific integrated circuits (ASICs) in the actual digital computer system in which they will be incorporated. Significantly, this invention permits the emulation of an ASIC device, and thus does not require the fabrication of an actual physical specimen of that device. Instead, this invention permits the use of a software model which facilitates debugging of the ASIC device and permits effective generation of system test vectors. Such an approach facilitates the system-level testing of ASIC devices prior to fabrication, by permitting both the generation of system test vectors and the debugging of the internal behavior of such ASIC devices without limiting the flexibility, with respect to other devices in the system, of either simulating such devices in software or utilizing actual physical specimens of such devices.

2 Claims, 2 Drawing Sheets

ASIC EMULATOR

FIELD OF THE INVENTION

This invention relates to the modeling of complex, very large scale integration (VLSI) digital devices, and in particular to the "real-time" simulation of application specific integrated circuits (ASICs) in the actual digital computer system in which they will be incorporated.

BACKGROUND OF THE INVENTION

Previous simulation models of complex VLSI integrated circuits either have been implemented solely in software (and thus have suffered from significant cost and performance limitations) or have required an actual physical specimen of the VLSI device being simulated (thereby limiting the feasibility of using such a model for debugging the VLSI device prior to fabrication).

When U.S. Pat. No. 4,590,581, entitled "Method and Apparatus For Modeling Systems of Complex Circuits" (the "Widdoes Patent") was filed on May 9, 1983, it was certainly the case that pure software models of complex logic devices were simply too slow to permit real-time simulation of a digital computer system. It is thus not surprising that the Widdoes Patent addressed this problem by providing a method for modeling the operation of a complex VLSI device in hardware, using an actual physical specimen of the VLSI device being modeled and a "personality module" which enabled that device to communicate in "real time" with a software simulation model of the other components in a digital computer system.

Currently, however, computer aided design tools permit the simulation in software of complex VLSI devices at speeds exceeding 10 MIPS ("million instructions per second"). Moreover, it has been estimated that the performance of such simulations will increase dramatically in the next decade, with systems attaining speeds in the "thousands of MIPS."

Such performance levels might at first blush appear to make pure software simulation models once again a viable alternative. Yet, as also noted in the Widdoes Patent, software simulation models have additional disadvantages. They are generally costly and time consuming to develop, particularly for a board manufacturer endeavoring to model the operation of a digital computer system comprising complex VLSI devices which are manufactured by others and are provided with extremely limited detailed specifications.

The solution provided by the Widdoes Patent enabled the simulation of a digital computer system in which an actual physical specimen of one complex VLSI device (such as the Motorola 68000 microprocessor) was coupled with various other devices simulated in software. As mentioned above, a personality module (i.e., a gate array device external to the VLSI device) enabled the slower simulation model to interact with the VLSI device which executed in real time.

In essence, the Widdoes Patent was directed at the problem of debugging various hardware devices of a digital computer system in a real-time environment. Although most of the hardware devices in such a system were capable of being modeled in software (enabling significantly greater debugging capabilities, including conditional assembly, the setting of breakpoints and the examination of internal states), it was simply not feasible to develop a software model for certain complex VLSI devices, particularly state of the art microprocessors such as the Motorola 68000. System designers incorporating such complex VLSI devices thus benefitted from the invention disclosed in the Widdoes Patent, which facilitated the effective debugging of the other hardware devices in their computer system in a real time system environment.

Although the invention disclosed in the Widdoes Patent facilitates the effective debugging of these other hardware devices, it suffers from a number of significant disadvantages when applied generally to today's problem of modeling digital computer systems in a real-time environment.

To begin with, it appears from the disclosure in the Widdoes Patent that only one complex device can be incorporated into the system, because all other devices must be simulated in software. Moreover, even if physical specimens of multiple VLSI devices could be incorporated, a customized personality module would have to be developed for each such device, a complex and costly solution likely to yield many errors. Finally, locating personality modules on the system board itself presents additional timing and other problems with respect to the integration of a "foreign" device (the personality module) into the actual computer system being tested.

As mentioned above, the advances in the performance of software simulation tools now permit effective software modeling, even of relatively complex ASIC devices, by the company who manufactures such devices pursuant to individual customers' specifications. The problem results, however, from the fact that an ASIC device, though it may have executed the test vectors provided by the customer with a 100% success rate (both in simulation and in physical device operation), will nevertheless often yield a much lower success rate when the actual ASIC chip is fabricated, plugged into a board and tested with the entire system.

In short, current chip-level simulation models have insufficient test vectors for the ASIC chip in a systems environment. What is needed is a real-time, systems-level simulation model of the computer system in which the customer's ASIC device will be incorporated. Such a systems model running in real time will generally expose the physical ASIC device to more complete test vectors than were provided initially to the software model of the ASIC device. See "The Era of the Microprocessor," Electronic Engineering Times Anniversary Issue, November, 1987, for a general discussion of this problem.

Whereas the Widdoes Patent addresses the simulation of certain hardware devices in a digital computer system, other simulation models have been aimed at the development and debugging of software executed by particular hardware devices in the system (such as general purpose microprocessors).

In-circuit emulators, such as those developed by Intel, as well as other hardware emulators, facilitate the development and debugging of software by providing a "black box" (the emulator) which is coupled to an actual physical specimen of the hardware device being emulated (e.g., the microprocessor which will execute the software being developed). The hardware emulator enables the software developer to interrupt execution of his/her software and examine certain internal states (generally by means of a personal computer also coupled to the emulator) far more easily than would otherwise be possible with mere software debugging tools.

Neither these hardware emulators nor the simulation model disclosed in the Widdoes Patent, however, provide a feasible solution to what is perhaps the most significant problem facing today's ASIC developers: the simulation of an ASIC device in a real-time systems environment prior to fabrication.

Practicality demands that the ASIC device be simulated and debugged (preferably in a real-time system environment) before it is fabricated. The invention disclosed in the Widdoes Patent does not address this problem. Although current simulation tools enable the creation of a software model for the ASIC device being developed for a particular customer, the approach adopted in the Widdoes Patent would require that either a separate software simulation model or a customized gate array (personality module) be developed for each of the other devices in the customer's system. This is clearly not practical.

Moreover, hardware emulators also require an actual physical specimen of the device being emulated. This approach is feasible when the purpose is not to debug that device, but to debug software being developed for execution on that device (or to verify a device that has been fabricated, checking if it operates with the test vectors as did the software model). When the purpose is to debug an ASIC device in a real-time systems environment, however, the cost of fabricating that device each time it is to be simulated is prohibitive.

Rarely can every device in the customer's desired computer system be modeled in software. The time and expense required by such an approach are simply too great to be feasible. Thus, a simulation model is required which enables the ASIC device under development to be modeled in software, but which permits that device to be simulated in real time in the actual computer system (comprising either physical specimens or software models of the other devices in the system) in which the ASIC device will be incorporated. Such a model is explained below.

SUMMARY OF THE INVENTION

Disclosed is an invention (the "ASIC Emulator") which overcomes the above obstacles, permitting an ASIC device under development to be emulated in a real-time system environment prior to the fabrication of that ASIC device (thus without requiring an actual physical specimen of that ASIC device). Moreover, each of the other devices in the system can either be modeled in software or incorporated into the ASIC Emulator as an actual physical specimen. In this manner, extensive internal debugging capabilities of the ASIC device are maintained (via a software model of the ASIC device), and comprehensive test vectors can be generated (due to the fact that the entire system is being simulated in real time).

The ASIC Emulator is coupled on one side to a workstation (executing the software model of the ASIC device being developed, as well as the software model of some or all of the other hardware devices in the system) and on the other side to the actual target system (containing a dummy package for the ASIC device, and other devices being modeled in software, and actual physical specimens of the remaining hardware devices in the system not being modeled in software).

The ASIC Emulator itself synchronizes the pin I/O produced by the ASIC software model (or software models of other devices in the target system) with the pin I/O produced by actual hardware devices in the target system. This is accomplished through the use of general purpose pin I/O registers and buffers (containing one bit per pin) and a control device (such as, in the preferred embodiment, the Intel 8031 microcontroller) which synchronizes the typically relatively slower pin I/O produced by the software model with the faster ("real time") pin I/O produced by the physical hardware specimens.

DETAILED DESCRIPTION OF PREFERRED EMBODIMENT p The following description is meant to be illustrative only and not limiting. While the preferred embodiment of this invention is described, other embodiments (which accomplish the invention's synchronization of software and hardware) will be obvious in view of the following description.

Figure 1:
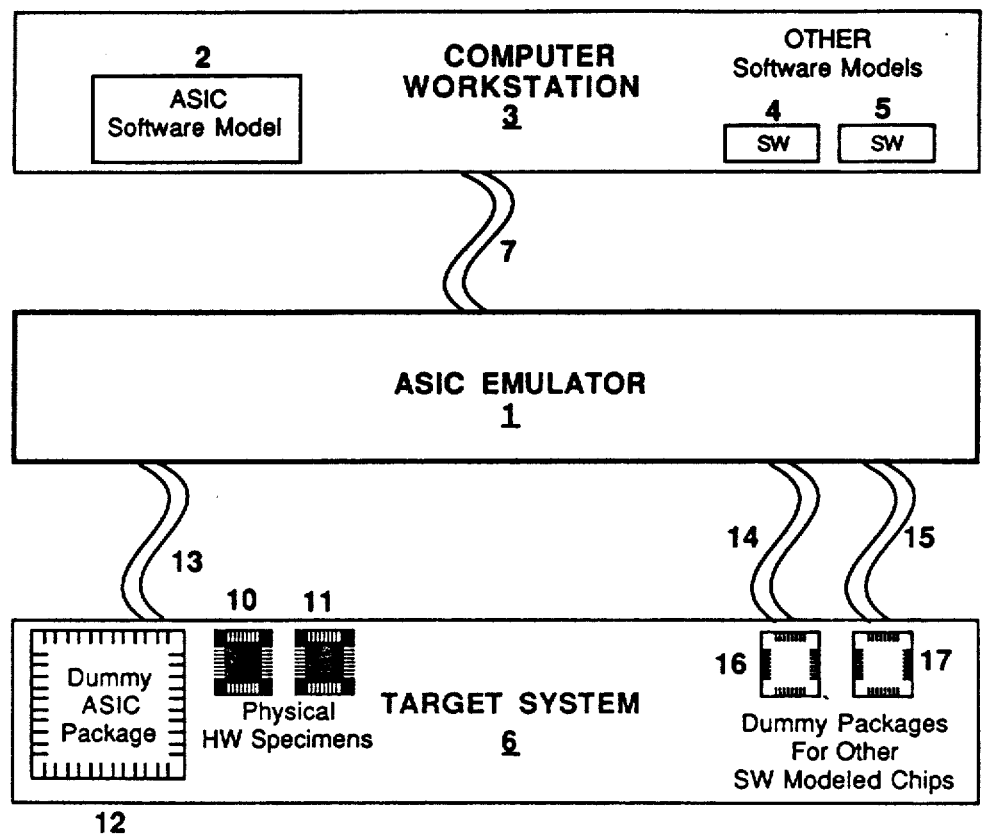
FIG. 1 illustrates a block diagram of the system configuration of the ASIC Emulator.

Looking at FIG. 1, it can be seen that the ASIC Emulator 1 does not require fabrication of a physical specimen of the ASIC device under development. Once a software model 2 of the ASIC device is developed, it can be executed on any Computer Workstation 3 supporting the language in which it was written (such as standard engineering workstations offered by vendors Apollo and SUN). The software model can be any model such as a behavioral model, logic model or transistor model or some combination thereof, of the circuit being evaluated.

Note that this invention also supports software models 4 and 5 of other devices (in addition to the ASIC device) which will be incorporated (once fabricated) into the Target System 6. Users of the ASIC Emulator 1 may even choose to utilize a software model of a chip which has been fabricated (but will not be placed into the target system of this invention), in order to debug internal states of that chip. The ASIC Emulator 1 synchronizes the software models 2, 4 and 5 running on the Computer Workstation 3 with the actual Target System 6.

The software models 2, 4 and 5 running on the Computer Workstation 3 are developed through well-known state-of-the-art techniques. No hardware, software or other modifications need be made to the Computer Workstation 3. The pin input/output signals (often called for short the pin I/O) to/from these software models are transmitted (in the preferred embodiment) through a SUN ASCII port (not shown), via cable 7 into an RS232 port into the ASIC Emulator 1. A comparable hardware/software driver in place of this RS232 interface can work equally well.

The ASIC Emulator 1 controls the pin I/O to/from the Computer Workstation 3 such that a test vector (representing the logical values of each pin) for the ASIC software model 2 (and for each of the other software models 4 and 5) is sent to and received from the Computer Workstation 3 during a user-specified time period (simulating a "machine cycle").

At the other end of the ASIC Emulator 1 lies the actual Target System 6 into which the ASIC device (and other software-modeled devices) will be incorporated. All devices not modeled in software are included as Physical Hardware Specimens 10 and 11 on an unmodified Target System 6. The only difference between the Target System 6 in the preferred embodiment of this invention and the actual target system itself is that dummy packages are utilized for each device modeled in software.

Thus, a test vector representing signals from the pins of the ASIC device is generated by the ASIC Software Model 2, passed to the ASIC Emulator which synchronizes that outgoing vector with the incoming vector into the Dummy ASIC Package 12 (which passes the vector through to the rest of the Target System 6), thereby simulating the actions which the actual ASIC device will take once fabricated and placed into its actual, real-time systems environment.

In this manner, the ASIC device is simulated (prior to fabrication) in a real-time systems environment virtually identical to that in which the ASIC device will be placed once fabricated. Such a simulation environment provides tremendous functional advantages to the ASIC designer, enabling sufficient system test vectors to be created without the expense of repeated fabrication.

Test vectors coming into the ASIC device are received by the Dummy ASIC Package 12, passed to the ASIC Emulator 1 via cable 13, where they are synchronized with the "machine cycle" of the ASIC software model 2, and then passed via cable 7 into the ASIC software model 2, which generates the next test vector, and so on.

The same process occurs for the vectors generated by the other software models 4 and 5, which are passed via cable 7 into the ASIC Emulator (where they are synchronized) with the "machine cycle" of the target system), and then passed via cables 14 and 15 into the Dummy Packages 16 and 17 which pass the vectors into the rest of the Target System 6.

Thus, all communication among Physical Hardware Specimens 16 and 17 occurs within Target System 6 (as it will in the actual target system). All communication involving devices modeled in software (including ASIC device) pass through the ASIC Emulator 1 and the dummy package corresponding to that software-modeled device.

In essence, the ASIC Emulator (described below in greater detail) provides general purpose pin I/O synchronization between selected software models and the actual target system in which those devices and others (physical specimens of which are included in this target system) are incorporated.

Yet, no customization of the Computer Workstation 3 or Target System 6 need be performed (with the exception of providing Dummy Packages 12, 16 and 17 and cables 7, 13, 14 and 15). Thus, the only customized components in the preferred embodiment of this invention are found within the ASIC Emulator itself.

Figure 2:
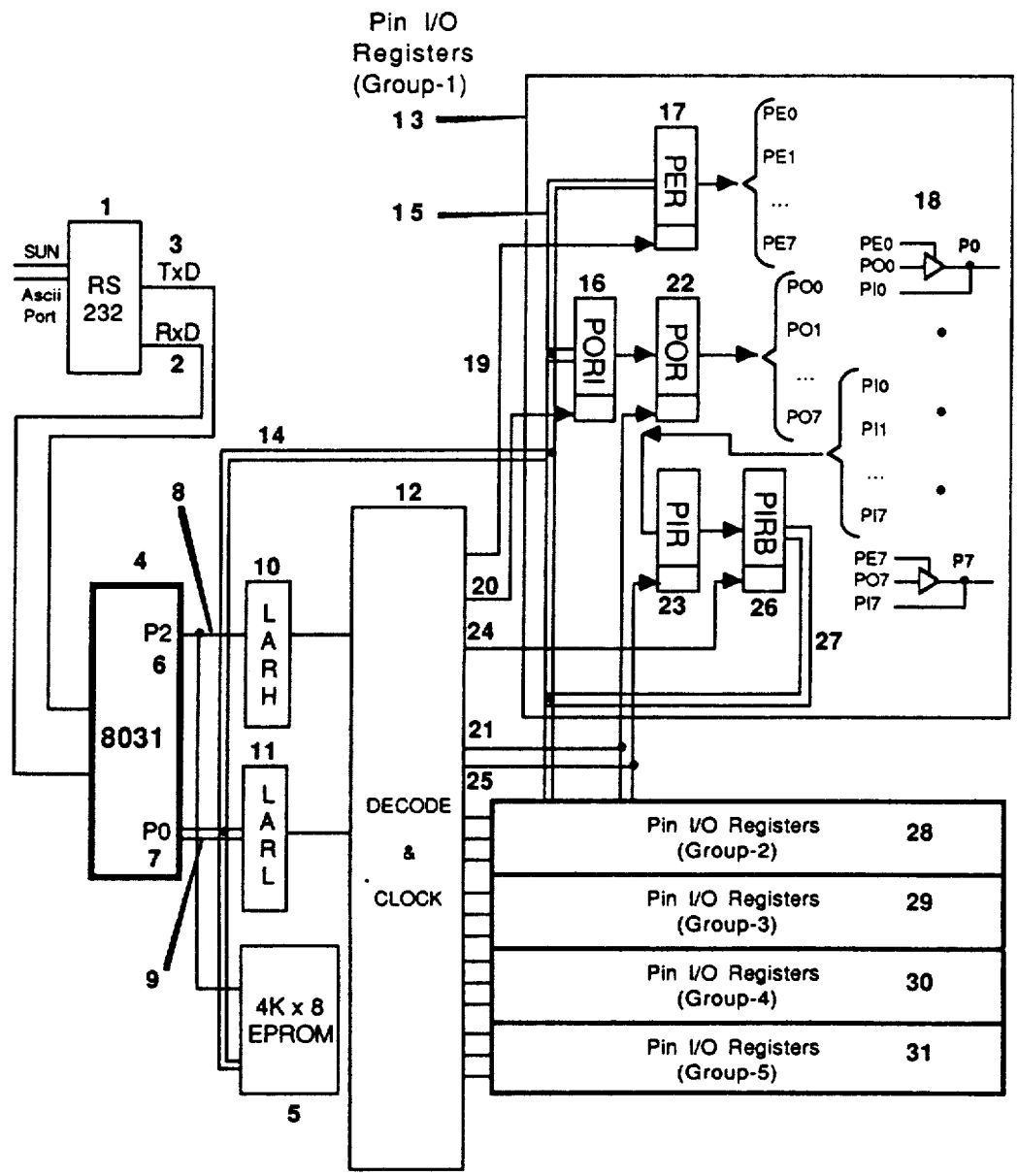
FIG. 2 illustrates the internal general pin configuration and control of the ASIC Emulator, which synchronizes the pin I/O of each software model with the actual target system hardware running in real time.

Looking at FIG. 2 (the preferred internal embodiment of the ASIC Emulator invention), it can be seen that external vectors transmitted from the Computer Workstation enter the ASIC Emulator via the SUN ASCII port (RS232 serial interface) 1. Information is received via lead 2 and transmitted via lead 3 by the ASIC Emulator's central controller 4 (an Intel 8031 microcontroller in the preferred embodiment).

The program controlling the 8031 4 is stored in 4K×8 EPROM 5. The user's program controls the conversion of pin I/O formats (from various software representations to hardware binary pin values) and the synchronization of the software on the Computer Workstation and the signals transmitted through the Dummy Packages on the Target System. This program is written by the user of the ASIC Emulator (who will be familiar with the software models and physical hardware specimens of each device in the system).

Instructions and data are received/transmitted by the 8031 4 via ports P2 6 and P0 7. When the 8031 generates an address to access other ASIC Emulator registers (or possibly instructions stored in EPROM), Port P2 6 is used to transmit the high-order byte of that address along local bus 8. Port P0 7 is used not only to transmit the low-order byte of that address along bidirectional bus 9, but is also used to receive instructions and data for use by the 8031 4.

The addresses transmitted through ports P2 6 and P0 7 are stored in registers LARH 10 and LARL 11, respectively. They are then supplied to Decode & Clock mechanism 12 which decodes these addresses and gates clocks into pin I/O registers 13 (e.g., to sample pin inputs or outputs of the ASIC Emulator). Decode & Clock mechanism 12 utilizes wellknow techniques to enable the 8031 4 to access (read and write) pin I/O registers 13 at instances of time specified by the user via the program stored in EPROM 5.

When pin output of a device is received by the 8031 4 from the software model of that device running on the Computer Workstation, that pin output is converted into binary output values corresponding to the pins of that device. These output values are transmitted via bidirectional busses 14 and 15 into Pin Output Register Input (PORI) register 16 (where it is buffered until it is time for it to be sent to the Target System).

Pin Enable Registers (PER) 17 are also set by the 8031 to enable a bidirectional pin to transmit output (as shown in the simple pin schematic 18 for each pin). Thus, bits (one bit per pin) in PER 17 can be set dynamically to enable bidirectional pins to function as output pins when the PER 17 bit is set, and as input pins when it is reset. Of course for unidirectional pins, the PER 17 bit can be set once (during initialization) to permanently classify that pin as either an input or an output pin.

When the 8031 4 (controlled by the user's program) determines that it is time for a software-modeled device to transmit output on its pins, it causes enable bits to be sent (via Decode & Clock mechanism 12) along local buses 19, 20 and 21, respectively, to enable the PER 17 registers (to gate their values into the pins illustrated in pin schematic 18), the PORI 16 registers (to gate their values into the Pin Output Registers 22 (POR)) and the POR 22 registers (to receive the PORI pin output bits and gate them into the pins illustrated in pin schematic 18).

Thus, during that simulated "machine cycle," all pin outputs (previously buffered in the PORI 16 registers) of one or more software-modeled devices are transmitted out of the ASIC Emulator (through a connector N bits wide where N represents the maximum number of pins representing the pins of all software-modeled devices) and into the dummy packages on the Target System corresponding to that software-modeled device(s).

Pin inputs from the dummy packages on the Target System are handled similarly. Inputs are received (at the pins illustrated in pin schematic 18) into Pin Input Registers 23 (PIR). As mentioned above, PER 17 registers (which can be modified dynamically) control whether bidirectional pins function as input or output pins. During each sample time or simulated "machine cycle" (controlled by the user program running on the 8031 4), the 8031 4 causes enable bits to be sent (via Decode & Clock mechanism 12) along local buses 19, 24 and 25, respectively, to enable the PER 17 registers (to gate their values into the pins illustrated in pin schematic 18), the Pin Input Register Buffers 26 (PIRB) (to receive the PIR 23 pin input values and transmit them via bidirectional bus 27 for sampling and conversion by the 8031, which eventually transmits those pin inputs into the Computer Workstation's software model corresponding to the device containing those input pins) and the PIR 23 registers (to latch input pin values).

Pin I/O registers 13 are implemented (in the preferred embodiment) as eight-bit registers due to the eight-bit busses on the 8031 4. To accommodate more than eight pins, the ASIC Emulator architecture actually contains multiple groups of Pin I/O Registers (groups 13, 28, 29, 30 and 31) In the preferred embodiment, these five groups of eight-bit registers permit a 40-pin ASIC device to be modeled in software.

During each sample time, or simulated "machine cycle," once all PER 17 and PORI 16 sets have been loaded, all PORs 22 are clocked with local bus 21, representing the entire vector to the target system at the same point in time. Sometime later (this time programmed by the user), all PIRs are clocked with local bus 25, sampling all inputs at the same point in time.

Additional software models can easily be accommodated (as can changes to the number of pins in a given ASIC or other device). If the maximum number of pins has been exceeded, additional groups of these Pin I/O Registers can easily be added to the modular ASIC Emulator architecture. It is important to note that (assuming the maximum number of pins has not been exceeded), regardless of the particular ASIC or other device being modeled in software, no hardware changes need be made to the ASIC Emulator. The user program can be modified externally.

In essence, the ASIC Emulator is a generalized Pin I/O synchronizer (between the software models running on the Computer Workstation and the dummy packages through which pin values are transferred to other hardware devices on the Target System). In this manner, the user of the ASIC Emulator can mix and match devices of the Target System, utilizing software models for the ASIC device under development as well as for any other device he chooses (whether or not already fabricated), and utilizing physical hardware specimens of all remaining devices simply by incorporating them into their actual target system environment. The only modifications to the Target System (as discussed above) are the use of dummy packages plugged into the empty sockets in place of each physical device being modeled in software. Of course, the dummy packages can be replaced by an equivalent structure which merely connects the correct wires in the cable from the ASIC emulator 1 (FIG. 1) to the correct socket pin receptacles or holes in the empty socket on the Target System 6.

I claim:

1. A structure for modeling the operation of a specified computing device in a target system, said structure comprising
   a computer for executing a software model of said specified computing device, said specified computing device not being physically present in said target system, said software model comprising
      software input pin means for receiving one or more software input pin signals representing the signals received as inputs to said specified computing device,
      software output pin means for transmitting one or more software output pin signals representing the signals generated as outputs of said specified computing device, and
      software modeling means for modeling in software the execution of said specified computing device, by which software input pin signals are transformed into software output pin signals, a target system comprising
   one or more physical computing devices physically present in said target system, and
   a dummy package placed in the target system where said specified computing device, once fabricated, is intended to be placed, said dummy package comprising
      bidirectional hardware input/output pin means for receiving as input and transmitting as output both hardware input pin signals, representing the signals generated as inputs to said specified computing device, and hardware output pin signals, representing the signals generated as outputs of said specified computing device,
   input synchronization means, operationally connected to said computer and said target system, for receiving hardware input pin signals from said target system and transforming said hardware input pin signals into software input pin signals by synchronizing the bidirectional hardware input/output pin means of said dummy package with the software input pin means of the software model of said specified computing device, and
   output synchronization means, operationally connected to said computer and said target system, for receiving software output pin signals from said computer and transforming said software output pin signals into hardware output pin signals by synchronizing the software output pin means of the software model of said specified computing device with the bidirectional hardware input/output pin means of said target system.

2. The structure of claim 1 also comprising
   one or more software models of additional software-modeled computing devices not physically present in said computer system, each of said software models capable of being executed by said computer and comprising software input means, software output pin means and software modeling means corresponding to the computing device being modeled,
   a dummy package for each computing device being modeled in software, said dummy package comprising bidirectional hardware input/output means for receiving as input and transmitting as output both hardware input pin signals and hardware output pin signals, and
   control means for converting software pin output signals from said computer, representing the signals generated as outputs from said specified computing device or from one of said additional software-modeled computing devices, into software pin input signals for said computer, representing the signals generated as inputs to another of said specified and additional software-modeled computing devices.

* * * * *